(12) United States Patent
McClain et al.

(10) Patent No.: US 6,617,523 B1
(45) Date of Patent: Sep. 9, 2003

(54) ASSEMBLY AND METHOD FOR RETAINING CIRCUIT BOARD ASSEMBLY COMPONENTS

(75) Inventors: Sean McClain, Havertown, PA (US); Terry W. Louth, Narvon, PA (US); Kenneth J. Neeld, West Chester, PA (US); Richard J. Werner, Shoreview, MN (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/978,874

(22) Filed: Oct. 17, 2001

(51) Int. Cl.[7] .................................................. H05K 1/16
(52) U.S. Cl. ......................... 174/260; 29/832; 361/760
(58) Field of Search ........................... 174/260; 361/760, 361/807; 257/727; 29/832

(56) References Cited

U.S. PATENT DOCUMENTS 4,929,185 A * 5/1990 Wong et al. ................ 361/810
5,724,229 A * 3/1998 Tustaniwskyi et al. ..... 361/719
6,282,761 B1 * 9/2001 Bewley et al. ................ 24/569

* cited by examiner

Primary Examiner—Kamand Cuneo
Assistant Examiner—Jeremy Norris
(74) Attorney, Agent, or Firm—Ratner & Prestia; Lise A. Rode; Mark T. Starr

(57) ABSTRACT

A fastener assembly and method are provided to engage a component to a circuit board assembly having a circuit board and a retainer positioned adjacent the circuit board. The fastener assembly comprises an elongated member extending between proximal and distal ends. The member includes a proximal portion having threads, and a distal portion having threads configured to engage the retainer of the circuit board assembly. A shoulder is spaced from the distal end of the member, and is configured to contact a surface of the retainer and to limit the travel of the distal end of the member toward the circuit board. The distance between the distal end and the shoulder of the member is equal to or more preferably less than the distance between the surface of the retainer and the circuit board, thereby reducing or eliminating interference between the distal end of the member and the circuit board. The fastener assembly also comprises a fastener adapted to engage the threads of the proximal portion of the member. The fastener is configured to engage the component to the circuit board assembly.

20 Claims, 6 Drawing Sheets

ASSEMBLY AND METHOD FOR RETAINING CIRCUIT BOARD ASSEMBLY COMPONENTS

FIELD OF THE INVENTION

This invention relates to an assembly and method for retaining circuit board assembly components. More specifically, this invention relates to an assembly and method for retaining a processor power pod to a printed circuit board.

BACKGROUND OF THE INVENTION

The process of manufacturing computer systems includes assembling the necessary electronic components. Often times the electronic components are fragile, and may become damaged during assembly. For example, when components such as processor power pods are installed on a board using threaded fasteners such as screws, tolerance stack up between mated parts may result in power pod retention screws being seated too deeply. Screws that protrude too deeply may lead to board damage in the form of shorting between voltage and ground planes of the board.

Various attempts have been made in the past in order to overcome the problem of board damage caused by fasteners. FIG. 1 is a cross-sectional view, illustrating a method currently utilized in the industry for fastening processor power pods to boards. A retainer 2 is secured to a printed circuit board 4. The circuit board 4 is a multi-laminate board, including a layer of copper with an epoxy laminate on its top surface. This configuration permits higher density routing of signal traces through voltage and ground planes. The retainer 2 contains threaded inserts 6 that rest flush against the circuit board 4, specifically the epoxy laminate layer. The threaded inserts 6 include internal threads 8 and a top surface 10. Processor power pods 12 are housed in die cast aluminum shells, and each shell includes mounting flanges 14 containing through-holes 16.

The currently utilized method for fastening processor power pods to boards includes placing a power pod 12 on a board 4 while ensuring the through-holes 16 of the power pod flanges 14 line up with their corresponding retainer threaded inserts 6. A retention screw 18 is then inserted through each power pod flange through hole 16, as illustrated in FIG. 1, engaging the threaded insert 6 of the retainer 2 to retain the power pod 12 to the board 4.

Although the size and length of the screw 18 is selected for a particular application in an attempt to avoid contact with the surface of the circuit board, it has been recognized that the distal end of the screw 18 may nevertheless contact the board in certain circumstances. For example, the flanges 14 are of different thicknesses depending upon the particular power pod 12 or location on a particular power pod 12, and this variation, combined with tolerance stack up between the associated mated parts (screw 18, retainer 2, and threaded insert 6), contributes to the retention screws 18 either travelling too deeply through the retainer threaded inserts 6, or not deeply enough to adequately engage the inserts 6. For example, if the threaded portion of the screw 18 is too long (i.e., beyond the expected length tolerance) and/or the power pod flange 14 is too thin (i.e., below the expected thickness tolerance), then the screw 18 may contact the board. Conversely, if the threaded portion of the screw 18 is too short and/or the power pod flange 14 is too thick, then insufficient engagement of the threads may result. Screws 18 that protrude too deeply may lead to board damage in the form of shorting between voltage and ground planes of the board. Screws 18 that do not travel deeply enough will not adequately retain the power pod 12 to the board 4.

Accordingly, there is a need for an assembly and method that can overcome tolerance variations while safely and effectively retaining components such as processor power pods to printed circuit boards.

SUMMARY OF THE INVENTION

This invention provides a fastener assembly configured to engage a component to a circuit board assembly having a circuit board and a retainer positioned adjacent the circuit board. The fastener assembly comprises an elongated member extending between proximal and distal ends. The member includes a proximal portion having threads, and a distal portion having threads configured to engage the retainer of the circuit board assembly. A shoulder is spaced from the distal end of the member, and is configured to contact a surface of the retainer and to limit the travel of the distal end of the member toward the circuit board. The distance between the distal end and the shoulder of the member is equal to or less than the distance between the surface of the retainer and the circuit board, thereby reducing or eliminating interference between the distal end of the member and the circuit board. The fastener assembly also comprises a fastener adapted to engage the threads of the proximal portion of the member. The fastener is configured to engage the component to the circuit board assembly.

This invention also provides a method for engaging a component to a circuit board assembly having a circuit board and a retainer positioned adjacent the circuit board. The method includes the step of engaging a distal portion of a stud to the retainer of the circuit board assembly. The method also includes the step of contacting a shoulder of the distal portion of the stud to a surface of the retainer, thereby limiting the travel of the distal end of the stud toward the circuit board, and thereby reducing or eliminating interference between the distal end of the stud and the circuit board. The proximal portion of the stud is extended through an aperture in the component, thereby positioning the component adjacent the retainer. A fastener is then engaged to a proximal portion of the stud, thereby engaging the component with respect to the circuit board assembly.

BRIEF DESCRIPTION OF THE DRAWINGS

The invention will be described with reference to the exemplary embodiments illustrated in the figures of which.

DETAILED DESCRIPTION OF THE INVENTION

Figure 1:
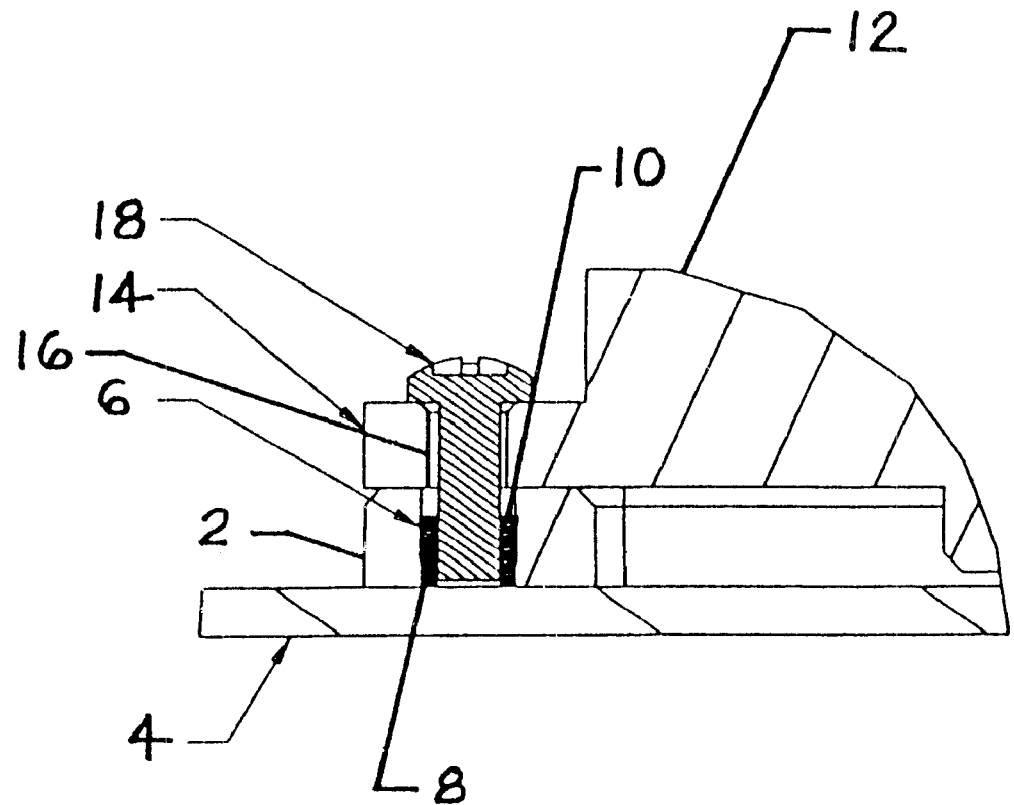
FIG. 1 is a cross-sectional side view of a conventional fastener assembly.

Preferred features of embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

When components such as processor power pods are installed on a board, tolerance stack up between mated parts may result in power pod retention screws being seated too deeply. Screws that protrude too deeply may lead to board damage in the form of shorting between voltage and ground planes of the board. Accordingly, the assembly and method of this invention overcome tolerance variations while safely and effectively retaining components such as processor power pods to printed circuit boards.

Generally, with reference to FIGS. 2 through 6, this invention provides a fastener assembly 20 configured to engage a component 12 to a circuit board 4 assembly having a circuit board 4 and a retainer 2 positioned adjacent the circuit board 4. The fastener assembly 20 comprises an elongated body 22 extending between proximal 24 and distal 26 ends. The body 22 includes a proximal portion 28 having threads, and a distal portion 30 having threads configured to engage the retainer 2 of the circuit board 4 assembly. A shoulder 32 is spaced from the distal end 26 of the body 22, and is configured to contact a surface of the retainer 2 and to limit the travel of the distal end 26 of the body 22 toward the circuit board 4. The distance between the distal end 26 and the shoulder 32 of the body 22 is equal to or more preferably less than the distance between the surface of the retainer 2 and the circuit board 4, thereby reducing or eliminating interference between the distal end 26 of the body 22 and the circuit board 4. The fastener assembly 20 also comprises a fastener 34 adapted to engage the threads of the proximal portion 28 of the body 22. The fastener 34 is configured to engage the component 12 to the circuit board 4 assembly.

This invention also provides a method for engaging a component 12 to a circuit board 4 assembly having a circuit board 4 and a retainer 2 positioned adjacent the circuit board 4. The method includes the step of engaging a distal portion 30 of a stud 22 to the retainer 2 of the circuit board 4 assembly. The method also includes the step of contacting a shoulder 32 of the distal portion 30 of the stud 22 to a surface of the retainer 2, thereby limiting the travel of the distal end 26 of the stud 22 toward the circuit board 4, and thereby reducing or eliminating interference between the distal end 26 of the stud 22 and the circuit board 4. The proximal portion 28 of the stud 22 is extended through an aperture 16 in the component 12, thereby positioning the component 12 adjacent the retainer 2. A fastener 34 is then engaged to a proximal portion 28 of the stud 22, thereby engaging the component 12 with respect to the circuit board 4 assembly.

Figure 2:
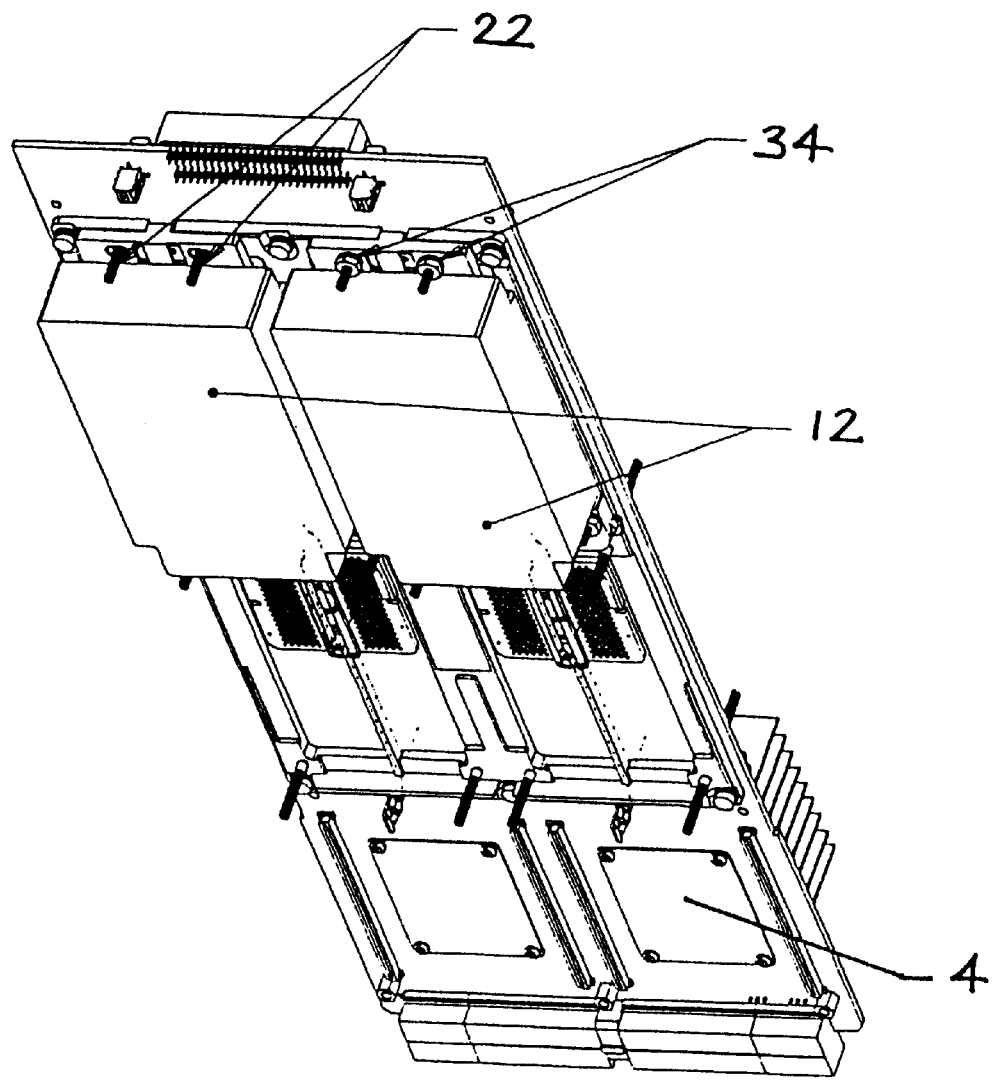
FIG. 2 is a perspective view of an embodiment of a circuit board assembly according to aspects of this invention.
Figure 3:
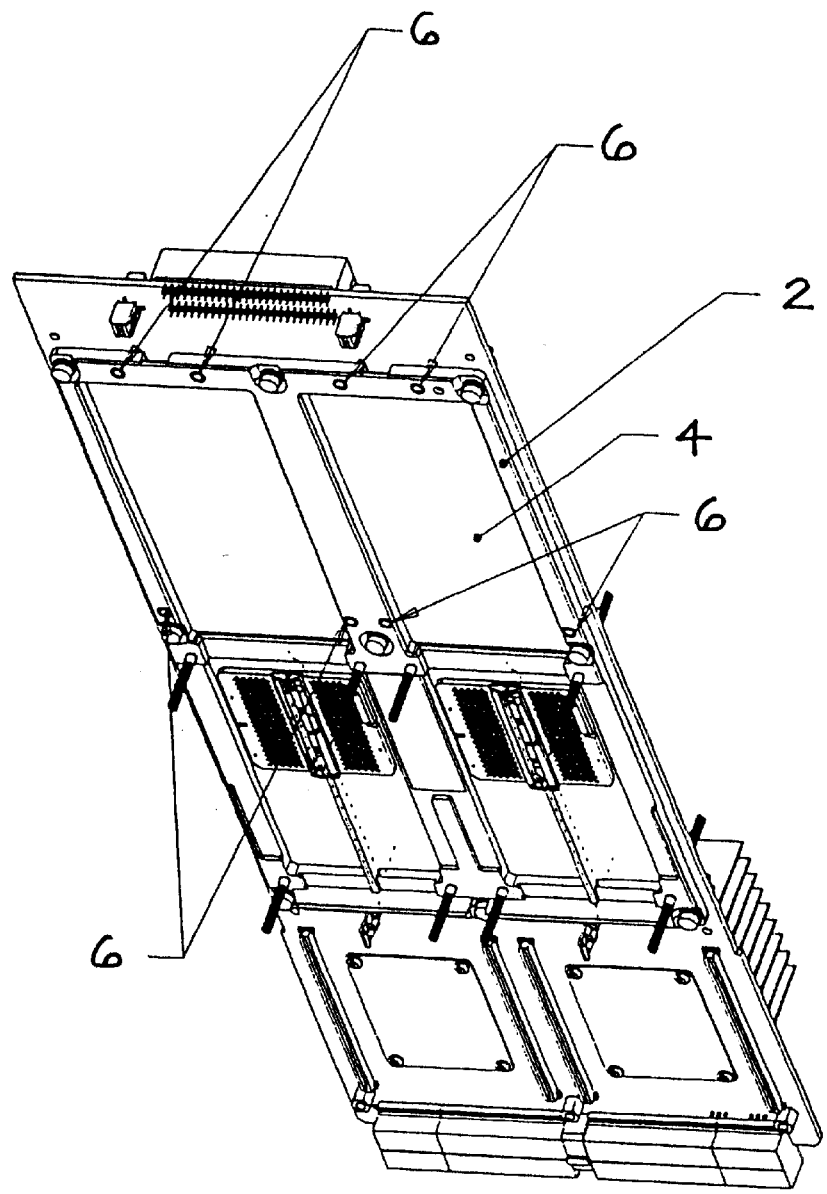
FIG. 3 is a perspective view of the circuit board assembly illustrated in FIG. 2, with components removed to reveal additional details.
Figure 4:
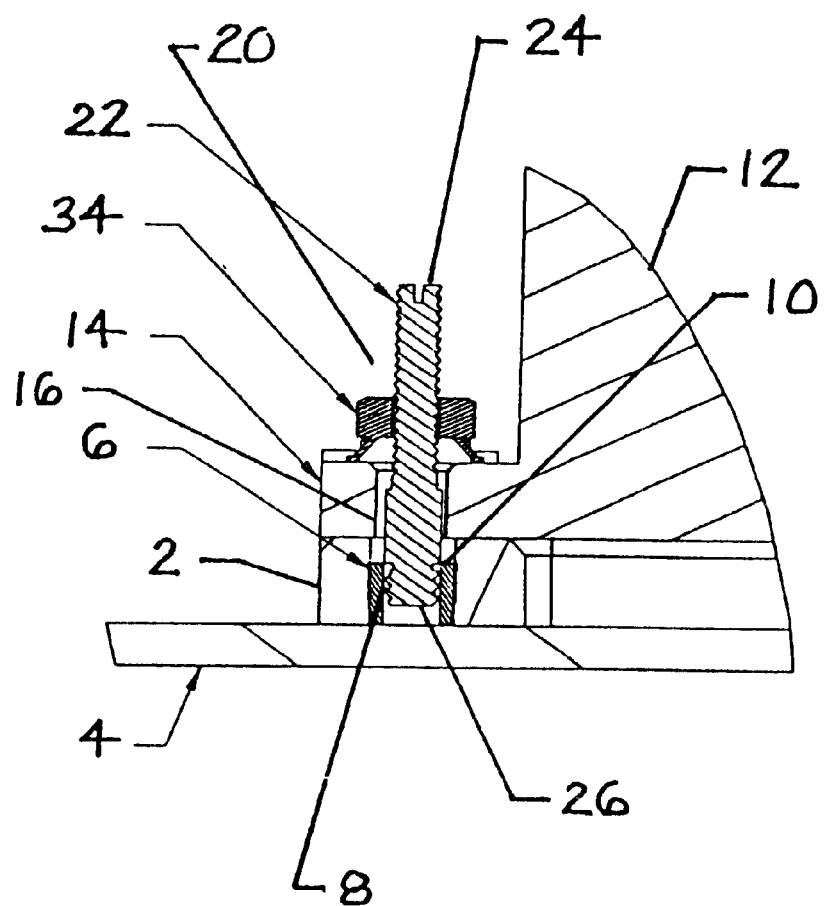
FIG. 4 is a cross-sectional side view of an embodiment of a fastener according to aspects of this invention.

One embodiment of a circuit board assembly, with which a fastener assembly according to this invention can be used, is illustrated in FIGS. 2 and 3. Power pod flanges 14 (FIG. 4) are captured by a fastener assembly 20 between a circuit board 4 retainer 2 and a shakeproof nut 34, thereby securing power pods 12 in position on the circuit board 4. FIG. 3 illustrates the board 4, which includes a retainer 2 that contains threaded inserts 6. FIG. 4 illustrates a detailed side view of the fastening arrangement of FIG. 2, showing the stud 22 engaged with the threaded insert 6 of the retainer 2.

The threaded insert 6 includes internal threads 8 and a top surface 10. Threaded inserts may be procured from Southco of Concordville, PA, under part number 72-1-XXX-13, depending upon the size necessary for the particular application. As in the exemplary embodiment illustrated in FIG. 4, the retainer 2 may include a threaded insert 6 mounted within a retainer body. Alternatively, the threaded insert 6 can be eliminated from the retainer 2 by forming the threads directly in the body of the retainer 2. If, however, the retainer 2 is formed from plastic or soft metal, it may be desirable to install a threaded insert into the retainer. This can be accomplished by press-fitting an insert into the body of the retainer or by molding the retainer body about the insert.

Figure 5:
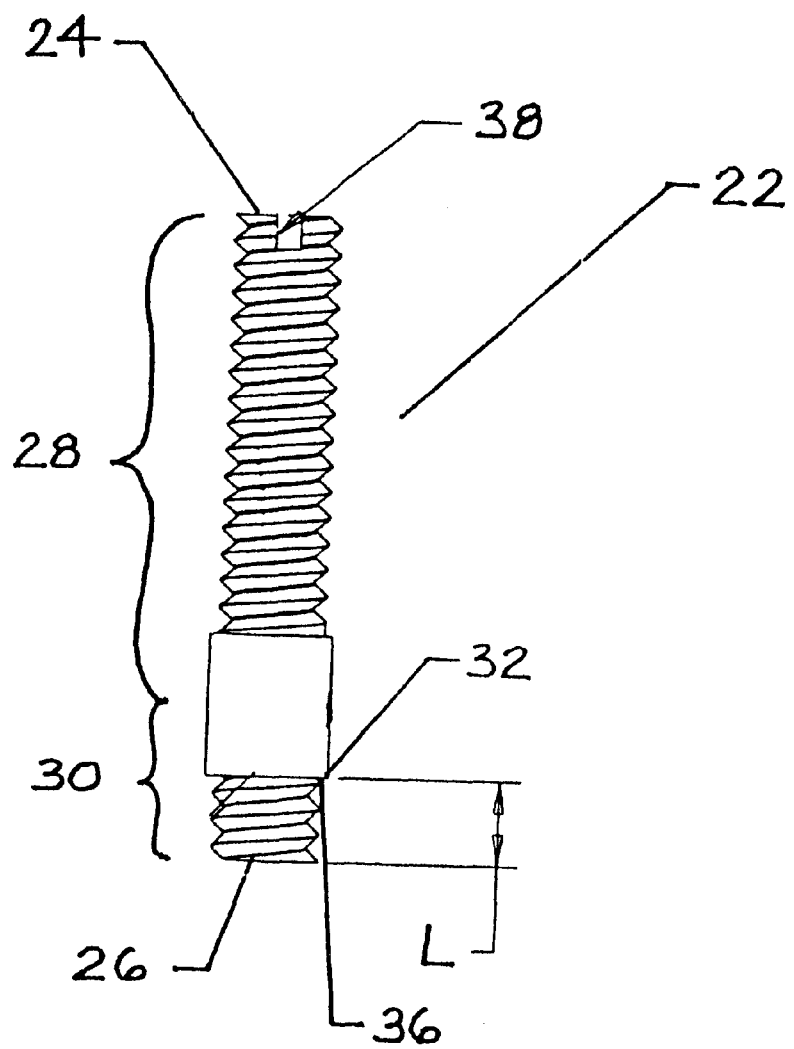
FIG. 5 is a side view of an exemplary embodiment of a component of the fastener assembly illustrated in FIG. 4.

FIG. 5 illustrates a detailed side view of an exemplary embodiment of the stud component 22 itself, and shows the shoulder 32 and the bearing surface 36 of the shoulder 32. A dimension "L" in FIG. 5 corresponds to the length of the threads formed on the distal portion 30 of the stud 22 (assuming that the threads run the full length of the stud between the shoulder 32 and the stud's distal end), or in other words, the length L corresponds to the distance between the bearing surface 36 of the shoulder 32 and the distal end 26 of the stud 22. This length L is selected to be equal to or more preferably less than the axial length (or thickness) of the retainer. For example, the length L is preferably selected to be equal to, or more preferably less than, the distance between (1) the surface of the retainer with which the shoulder 32 of the stud 22 is in contact and (2) the surface of the retainer positioned adjacent the circuit board. If the retainer includes an insert such as insert 6, and the shoulder 32 of the stud 22 contacts a surface of the insert 6, then the length L is preferably selected to be equal to, or more preferably less than, the distance between (1) the surface of the insert of the retainer with which the shoulder 32 of the stud 22 is in contact and (2) the surface of the insert positioned adjacent the circuit board. If the insert includes threads along its entire length, then the length L is preferably selected to be equal to, or more preferably less than, the depth of the internal threads 8 of the threaded insert 6 of the retainer 2, as shown in FIG. 4.

Figure 6:
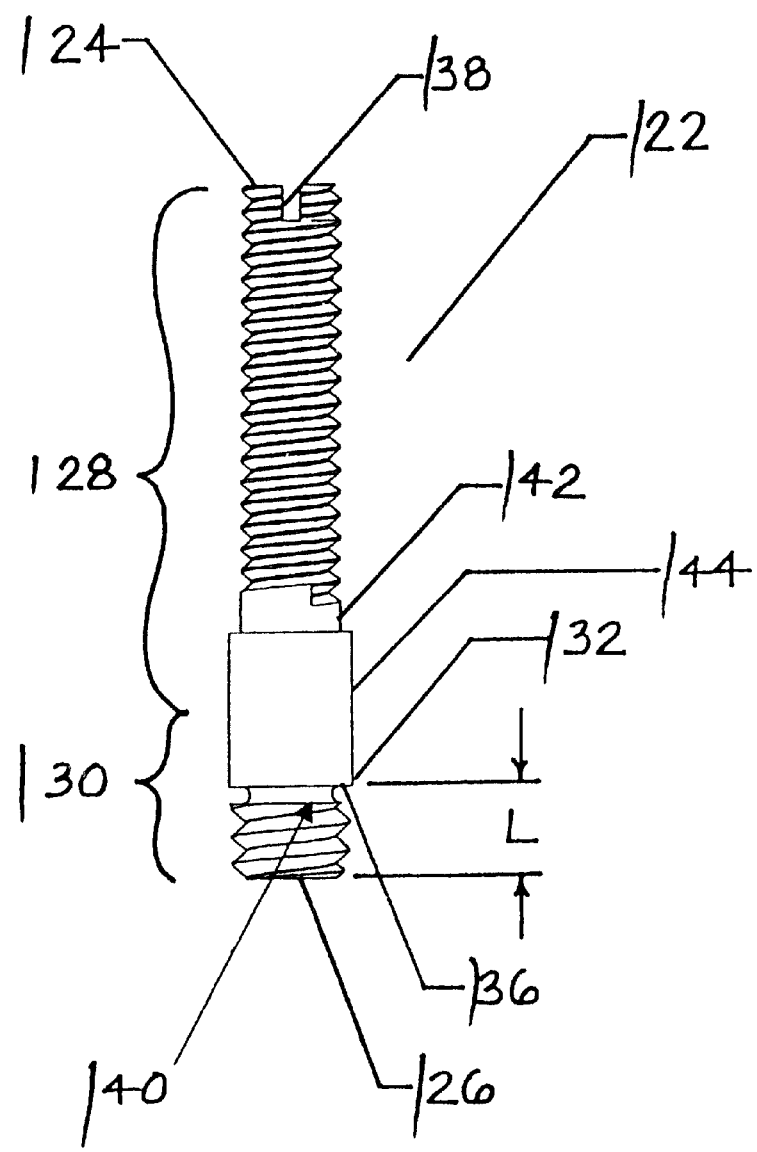
FIG. 6 is a side view of another exemplary embodiment of a component of the fastener assembly illustrated in FIG. 4.

FIG. 6 illustrates a detailed side view of another exemplary embodiment of the stud component 122 itself, and shows the shoulder 132 and the bearing surface 136 of the shoulder 132. A dimension "L" in FIG. 6 corresponds to the distance between the bearing surface 136 of the shoulder 132 and the distal end 126 of the stud 122. This length L is selected to be equal to or more preferably less than the axial length (or thickness) of the retainer, as described above with respect to the stud 22 of FIG. 5. A recess or thread relief 140 is positioned between the threads of the distal portion 130 and the bearing surface 136 of the shoulder 132. This recess 140 allows for easier machining of the threads by eliminating the need to run the threads up against the bearing surface 136 of the shoulder 132. The depth of the recess 140 may be selected to correspond to the minor diameter of the threads on the distal portion 130. A similar feature is provided at the proximal portion 128 of the stud 122 in the form of a thread run-out portion 142, positioned between the threads of the proximal portion 128 and the non-threaded portion 144 of the stud 122.

As used herein, the term "retainer" refers to any structure that is capable of retaining the elongated member or stud. In the exemplary embodiment of the fastener assembly illustrated in FIG. 4, the retainer includes an insert mounted within a retainer body. As indicated previously, the insert can be omitted. The retainer body can also be omitted. Accordingly, the surface of the retainer to be contacted by the shoulder of the elongated member or stud can be a surface of an insert, a surface of a retainer body, or any other surface associated with the retainer.

Referring again to FIG. 4, when the distal portion 30 of the stud 22 is engaged with the internal threads 8 of the threaded insert 6, the shoulder 32 limits the travel of the stud 22 when the bearing surface 36 of the shoulder 32 contacts the top surface 10 of the threaded insert 6. The distal end 26 of the stud 22 is thereby prohibited from contacting the circuit board 4, thereby avoiding board damage.

FIG. 5 illustrates one option for the thread configuration of the stud 22. The threads of the proximal 28 and distal 30 portions are shown as being substantially the same. However, threads of different sizes and types may be desirable in some circumstances. For example, a smaller diameter for the proximal portion 28 may be preferred, as illustrated in FIG. 6, to avoid clearance issues associated with a larger drive tool during assembly and disassembly. Additionally, although it is preferred that the threads of the proximal 28 and distal 30 portions are of the same type such as right-hand (i.e., advance into an internal thread when turned clockwise), the threads of the proximal 28 and distal 30 portions may be of different types (e.g., one portion containing right-hand threads and the other portion containing left-hand threads).

Referring back to FIG. 2, the studs 22 provide a means for fastening a power pod 12 to the board 4. The studs 22 pass through apertures 16 in the power pod flanges 14. When a power pod 12 is installed on the board 4 and the throughholes 16 of the power pod flanges 14 are aligned with their respective threaded inserts 6 contained in the retainer 2, a stud 22 is inserted in each throughhole 16 and is engaged with the internal threads 8 of a corresponding threaded insert 6, as shown in FIG. 4. A shakeproof nut 34 is then mated securely to the proximal portion 28 of each protruding stud 22, as illustrated in FIGS. 2 and 4. A shakeproof nut 34 is a conventional nut with a pre-assembled washer, as shown in FIG. 4. The fastener assembly 20 installed in this manner safely and effectively retains components such as power pods 12 to circuit boards 4.

The preferred materials for use in forming the fastener assembly 20 are stainless steel for the stud 22, and carbon steel for the shakeproof nut 34. However, alternative metal or plastic materials are suitable as well. The materials selected may vary within the scope of this invention, as long as the strength of the selected materials are sufficiently rigid to secure a component to a board.

One embodiment of a method according to this invention begins with the board 4 including a retainer 2, as shown in FIG. 3. The retainer 2 contains threaded inserts 6 that rest flush against the circuit board 4, as shown in FIG. 4. The threaded inserts 6 include internal threads 8 and a top surface 10, as shown in FIG. 4.

A power pod 12 is installed on the board 4, ensuring the through holes 16 of the power pod flanges 14 are aligned with their respective threaded inserts 6 of the retainer 2. The distal end 26 of a stud 22, shown in FIG. 5 for example, is then inserted in each power pod flange through hole 16, as shown in FIG. 2. The distal portion 30 is then engaged with the internal threads 8 of the threaded insert 6, utilizing the drive slot 38 located at the proximal end 24, shown in FIG. 5 for example, until the bearing surface 36 of the stud shoulder 32 contacts the top surface 10 of the threaded insert 6 (or any other surface of the retainer 2), as shown in FIG. 4. The distance between the distal end 26 and the bearing surface 36 of the shoulder 32 is equal to or more preferably less than the thickness of the retainer at the location at which the stud is retained. For instance, in the exemplary embodiment illustrated in FIG. 4 in which the threads extend along the entire length of the insert 6, the distance between the distal end 26 and the bearing surface 36 of the shoulder 32 (or length L) is equal to or more preferably less than the depth of the internal threads 8 of the threaded insert 6, such that when the bearing surface 36 contacts the top surface 10 of the threaded insert 6, the travel of the stud 22 is limited. The distal end 26 of the stud 22 is also prohibited from damaging the circuit board 4, as illustrated in FIG. 4.

A shakeproof nut 34 is then mated securely to the proximal portion 28 of each protruding stud 22, as illustrated in FIGS. 2 and 4. Accordingly, the power pod 12 is then safely and effectively retained on the circuit board 4. In other words, the fastener assemblies 20 capture the power pod flanges 14 between the shakeproof nuts 34 and the retainer 2, while preventing the studs 22 from contacting the circuit board 4.

Although exemplary embodiments of the fastener assembly and method according to this invention have been described, there are others that support the spirit of the invention and are therefore within the contemplated scope of the invention. For example, with respect to the fastener assembly 20, the fastener 34 is not limited to a shakeproof nut 34, and may comprise a different fastening method (such as a conventional nut and washer, a lock washer, a conventional nut combined with a thread locking compound, a "C"-clip, a rivet head, or any other known threaded or unthreaded fastening means) to secure the power pod 12 to the circuit board 4. The drive 38 located at the proximal end 24 of the stud 22 is not limited to a slot, and may comprise any number of means for rotating or applying torque (such as hexagonal, Phillips, Torx, or Allen, or other known means for rotating). The stud 22 may be modified dimensionally to fit any application that benefits from a controlled depth dimension on one end while allowing a wide thickness tolerance variation on the opposite end.

It will be appreciated that other modifications can be made to the illustrated embodiments without departing from the scope of the invention. The scope of the invention is separately defined in the appended claims.

What is claimed is:

1. A fastener assembly configured to engage a component to a circuit board assembly having a circuit board and a retainer positioned adjacent the circuit board, said fastener assembly comprising:

an elongated member extending between proximal and distal ends, said member including a proximal portion having threads, and said member including a distal portion having threads configured to engage the retainer of the circuit board assembly and a shoulder spaced from said distal end of said member, said shoulder being configured to contact a surface of the retainer and to limit the travel of said distal end of said member toward the circuit board, wherein the distance between said distal end and said shoulder of said member is equal to or less than the distance between the surface of the retainer and the circuit board, thereby reducing or eliminating interference between said distal end of said member and the circuit board; and a fastener adapted to engage said threads of said proximal portion of said member, said fastener being configured to engage the component to the circuit board assembly.

2. The fastener assembly recited in claim 1, wherein said elongated member comprises a means for rotating said distal portion of said member with respect to the retainer of the circuit board.

3. The fastener assembly recited in claim 2, wherein said means comprises a slot located at said proximal end of said member.

4. The fastener assembly recited in claim 1, wherein the size of said threads of said proximal portion of said member is different from that of said threads of said distal portion of said member.

5. The fastener assembly recited in claim 1, wherein said threads of said proximal portion and said distal portion of said member are substantially the same.

6. The fastener assembly recited in claim 1, wherein said threads of said proximal portion and said distal portion of said member are of different types.

7. The fastener assembly recited in claim 1, wherein said elongated member is substantially cylindrical in shape.

8. The fastener assembly recited in claim 1, wherein said fastener comprises a nut.

9. The fastener assembly recited in claim 8, wherein said nut is substantially shakeproof.

10. The fastener assembly recited in claim 9, wherein said substantially shakeproof nut includes a washer.

11. A circuit board assembly comprising:
    a circuit board;
    a retainer positioned adjacent said circuit board;
    a component positioned adjacent said retainer; and
    a stud having a body extending between proximal and distal ends, said body including a distal portion having threads configured to engage said retainer and a shoulder spaced from said distal end of said body, said shoulder being configured to contact a surface of the retainer and to limit the travel of said distal end of said body toward said circuit board, wherein the distance between said distal end and said shoulder of said body is equal to or less than the distance between said surface of said retainer and said circuit board, thereby reducing or eliminating interference between said distal end of said body and said circuit board; and
    a fastener adapted to engage a proximal portion of said body of said stud, thereby engaging said component adjacent said retainer.

12. The circuit board assembly recited in claim 11, wherein said retainer comprises an insert configured to be mounted adjacent said circuit board.

13. The circuit board assembly recited in claim 12, wherein said insert is engaged within a retention member secured adjacent to said circuit board assembly.

14. The circuit board assembly recited in claim 11, wherein said component comprises a processor power pod.

15. The circuit board assembly recited in claim 11, wherein a slot is defined at said proximal end of said stud.

16. The circuit board assembly recited in claim 11, wherein said fastener comprises a nut.

17. A method for engaging a component to a circuit board assembly having a circuit board and a retainer positioned adjacent the circuit board, said method comprising the steps of:
    (a) engaging a distal portion of a stud to the retainer of the circuit board assembly;
    (b) contacting a shoulder of the distal portion of the stud to a surface of the retainer, thereby limiting the travel of the distal end of the stud toward the circuit board, and thereby reducing or eliminating interference between the distal end of the stud and the circuit board;
    (c) extending the proximal portion of the stud through an aperture in the component; and
    (d) engaging a fastener to a proximal portion of the stud, thereby engaging the component with respect to the circuit board assembly.

18. The method recited in claim 17, wherein said engaging step (a) comprises threading the distal portion of the stud into the retainer of the circuit board assembly.

19. The method recited in claim 17, wherein said extending step (c) comprises positioning the proximal portion of the stud through an opening in the component, thereby positioning the component adjacent the retainer.

20. The method recited in claim 17, wherein said engaging step (d) comprises threading the fastener to the proximal portion of the stud, thereby engaging the component to the circuit board.

* * * * *